(12) United States Patent
Lee et al.

(10) Patent No.: US 7,425,476 B2
(45) Date of Patent: Sep. 16, 2008

(54) MANUFACTURING METHOD OF A THIN FILM TRANSISTOR ARRAY PANEL

(75) Inventors: Woo-Geun Lee, Yongin-si (KR); Hye-Young Ryu, Seoul (KR); Sang-Gab Kim, Seoul (KR); Jang-Soo Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 287 days.

(21) Appl. No.: 11/242,696

(22) Filed: Oct. 4, 2005

(65) Prior Publication Data

US 2006/0073645 A1 Apr. 6, 2006

(30) Foreign Application Priority Data

Oct. 6, 2004 (KR) .................... 10-2004-0079521

(51) Int. Cl.
*H01L 21/00* (2006.01)
(52) U.S. Cl. .................... 438/151; 438/155; 438/275
(58) Field of Classification Search ................ 438/942, 438/158, 151, 155, 275, 159, 163
See application file for complete search history.

(56) References Cited

U.S. PATENT DOCUMENTS 4,231,811 A 11/1980 Somekh et al. ............. 438/301

(Continued)

FOREIGN PATENT DOCUMENTS

JP 2002-151381 5/2002

(Continued)

OTHER PUBLICATIONS

International Business Machines Corporation: "One resist layer with several functions using different thickness in pearl-less LCD" Research Disclosure, Mason Publications, Hampshire, GB, vol. 409, No. 87, May 1998.

*Primary Examiner*—Tuan H Nguyen
(74) *Attorney, Agent, or Firm*—F. Chau & Associates, LLC

(57) ABSTRACT

A method of manufacturing a thin film transistor array panel includes forming a gate line including a gate electrode, forming a gate insulating layer on the gate line, forming a semiconductor stripe on the gate insulating layer; forming ohmic contacts on the semiconductor stripe, forming a data line including a source electrode and a drain electrode on the ohmic contacts, depositing a passivation layer on the data line and the drain electrode, and forming a pixel electrode connected to the drain electrode. The formation of the data line and the drain electrode, the ohmic contacts, and the semiconductor stripe includes depositing an intrinsic silicon layer, an extrinsic silicon layer, and a conductor layer on the gate insulating layer, forming a photoresist including a second portion corresponding to a channel area between the source electrode and the drain electrode, and a first portion corresponding to a wire area on the data line and the drain electrode, wherein the first portion is thicker than the second portion, etching the conductor layer corresponding to a remaining area except for the wire and the channel area using the photoresist as an etch mask, removing the second portion to expose the conductor layer on the channel areas, etching the intrinsic silicon layer and the extrinsic silicon layer on the remaining area, etching the conductor layer and the extrinsic silicon layer on the channel areas, and removing the first portion.

9 Claims, 22 Drawing Sheets

U.S. PATENT DOCUMENTS

| | | | |
|---|---|---|---|
| 6,287,899 B1 | 9/2001 | Park et al. | 438/149 |
| 6,562,670 B2 * | 5/2003 | Shih | 438/160 |
| 6,596,656 B2 * | 7/2003 | Tanaka et al. | 438/585 |
| 2002/0123241 A1 | 9/2002 | Kido | 438/784 |
| 2003/0136971 A1 * | 7/2003 | Rhee et al. | 257/98 |

FOREIGN PATENT DOCUMENTS

| | | |
|---|---|---|
| JP | 2003-158068 | 5/2003 |
| JP | 2004-200651 | 7/2004 |

\* cited by examiner

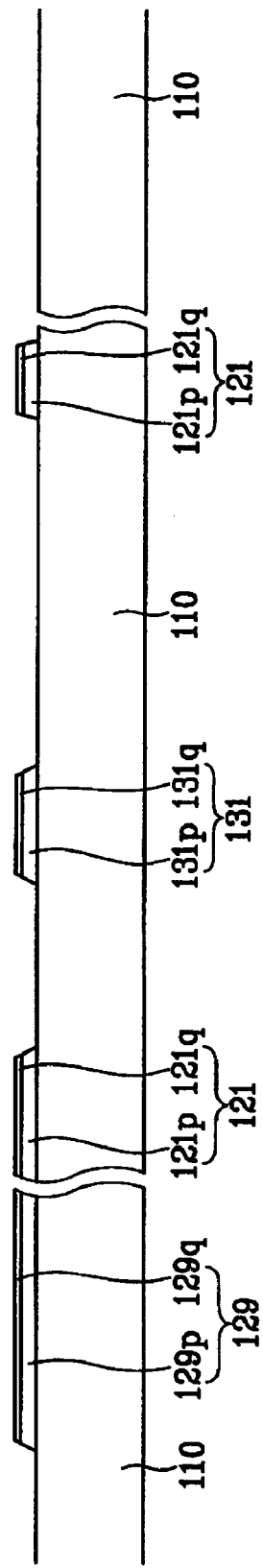

MANUFACTURING METHOD OF A THIN FILM TRANSISTOR ARRAY PANEL

CROSS-REFERENCE TO RELATED APPLICATION

This application claims priority to Korean Patent Application No. 2004-79521 filed on Oct. 6, 2004, the contents of which are herein incorporated by reference in their entirety.

BACKGROUND OF THE INVENTION

1. Technical Field

The present disclosure relates to a manufacturing method of a thin film transistor array panel, and more particularly to a manufacturing method of a thin film transistor array panel using a photolithography process.

2. Discussion of Related Art

Liquid crystal displays (LCDs) are widely used flat panel displays. An LCD includes two panels comprising field-generating electrodes. A liquid crystal (LC) layer is interposed between the two panels. The LCD displays images by applying voltages to the field-generating electrodes to generate an electric field in the LC layer. The electric field determines orientations of LC molecules in the LC layer to adjust polarization of incident light.

LCDs may include field-generating electrodes on respective panels. A type of LCD including field-generating electrodes on respective panels comprises a plurality of pixel electrodes arranged in a matrix at one panel and a common electrode on the other panel. The common electrode covers an entire surface of a panel. The image display of the LCD is accomplished by applying individual voltages to the respective pixel electrodes. For applying the individual voltages, the panel includes a plurality of three-terminal thin film transistors (TFTs) connected to the respective pixel electrodes, a plurality of gate lines transmitting signals for controlling the TFTs, and a plurality of data lines transmitting voltages to be applied to the pixel electrodes.

A panel for an LCD may comprise a layered structure including several conductive layers and insulating layers. Several photolithography steps are performed for manufacturing the LCD panel. A reduction of the number of the photolithography steps will reduce process time and production cost.

SUMMARY OF THE INVENTION

According to an embodiment of the present invention, a method of manufacturing a thin film transistor array panel includes forming a gate line including a gate electrode, forming a gate insulating layer on the gate line, forming a semiconductor stripe on the gate insulating layer, forming ohmic contacts on the semiconductor stripe, forming a data line including a source electrode and a drain electrode on the ohmic contacts, depositing a passivation layer on the data line and the drain electrode, and forming a pixel electrode connected to the drain electrode. The formation of the data line and the drain electrode, the ohmic contacts, and the semiconductor stripe includes depositing an intrinsic silicon layer, an extrinsic silicon layer, and a conductor layer on the gate insulating layer, forming a photoresist including a second portion corresponding to a channel area between the source electrode and the drain electrode, and a first portion corresponding to a wire area on the data line and the drain electrode, wherein the first portion is thicker than the second portion, etching the conductor layer corresponding to a remaining area except for the wire area and the channel area using the photoresist as an etch mask, removing the second portion to expose the conductor layer on the channel areas, etching the intrinsic silicon layer and the extrinsic silicon layer on the remaining area, etching the conductor layer and the extrinsic silicon layer on the channel areas, and removing the first portion.

The photoresist may be formed in a photolithography process using a single exposure mask.

A thin film with intermediate transmittance may be formed on the mask corresponding to the second portion, and a plurality of slits is formed on the mask corresponding to the second portion, wherein a width of the slits or a distance between the slits is smaller than the resolution of a light exposer used for the photolithography.

The second portion can be formed by a reflow process.

According to an embodiment of the present invention, a method of forming a photoresist for manufacturing a thin film transistor array panel comprises forming a first portion of the photoresist corresponding to a wire area on a data line and a drain electrode, and a second portion of the photoresist corresponding to a channel area between a source electrode and the drain electrode, wherein the first portion is thicker than the second portion.

A thickness of the second portion may be equal to or less than about 4,000 Å.

BRIEF DESCRIPTION OF THE DRAWINGS

Preferred embodiments of the present disclosure can be understood in more detail from the following description taken in conjunction with the accompanying drawings in which:

FIGS. 5A and 5B are sectional views of the TFT array panel shown in FIG. 4 taken along the lines VA-VA' and VB-VB', respectively;

DETAILED DESCRIPTION OF PREFERRED EMBODIMENTS

Figure 1:
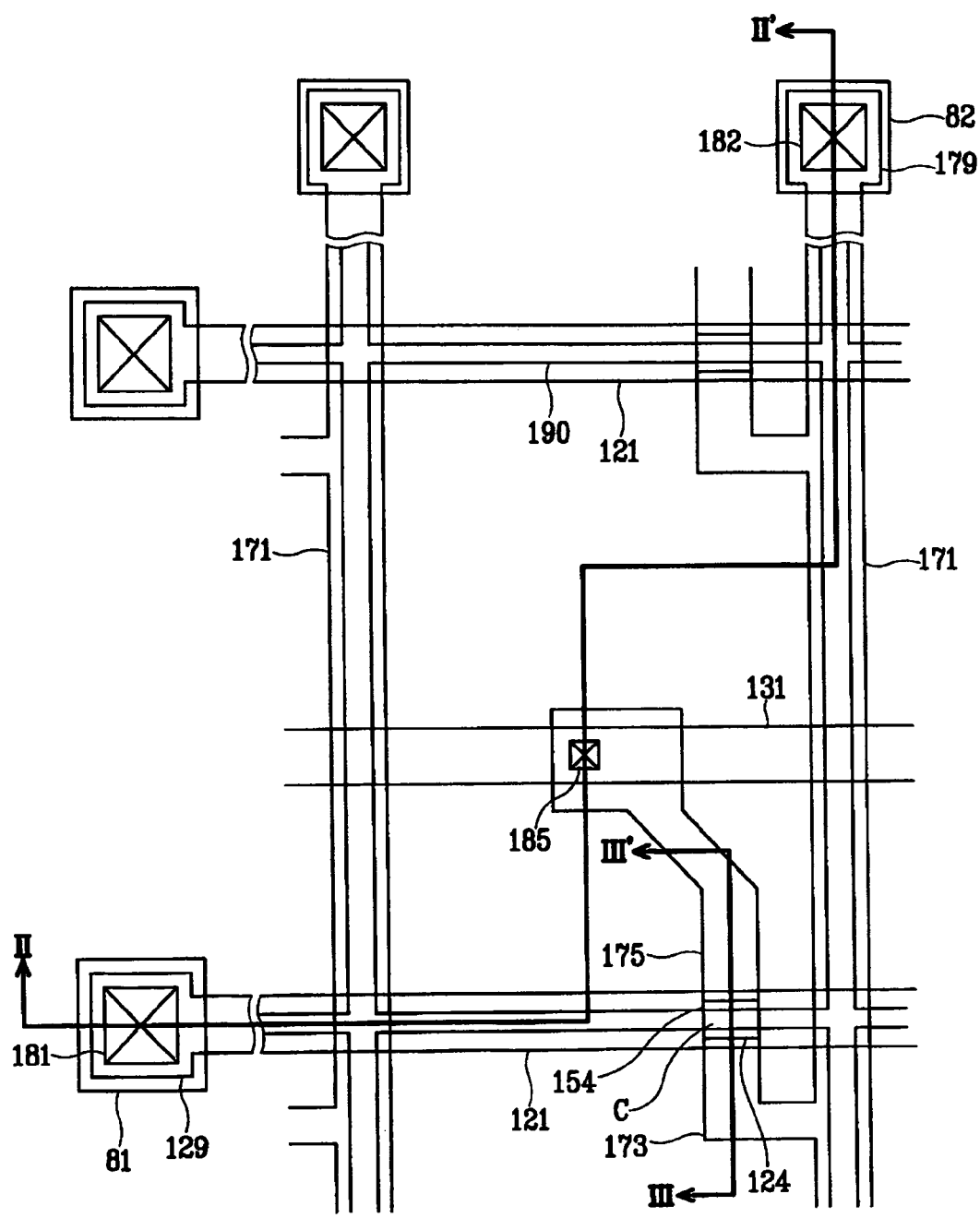
FIG. 1 is a layout view of a TFT array panel for an LCD according to an embodiment of the present invention.

Preferred embodiments of the present invention will be described below in more detail with reference to the accompanying drawings. The present invention may, however, be embodied in many different forms and should not be construed as limited to the embodiments set forth herein. In the drawings, a thickness of layers and regions are exaggerated for clarity. Like numerals refer to like elements throughout. It will be understood that when an element such as a layer, region or substrate is referred to as being "on" another element, it can be directly on the other element or intervening elements may also be present.

Figure 2:
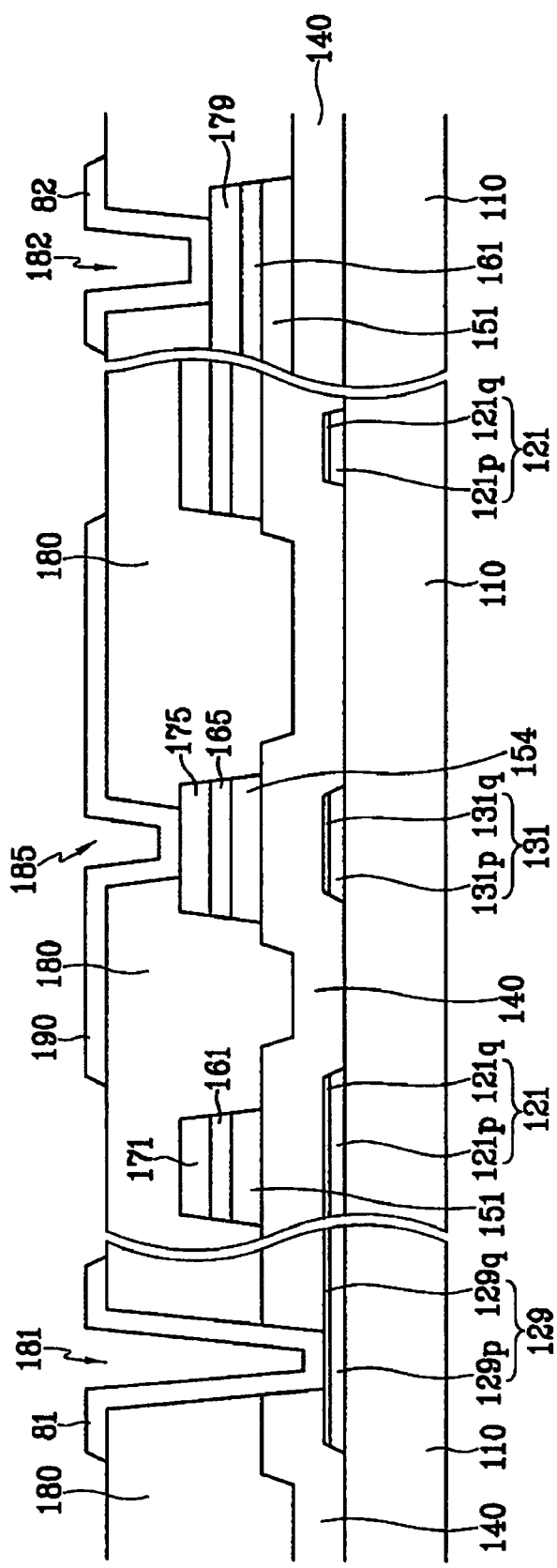
FIGS. 2 and 3 are sectional views of the TFT array panel shown in FIG. 1 taken along the lines II-II' and III-III', respectively.
Figure 3:
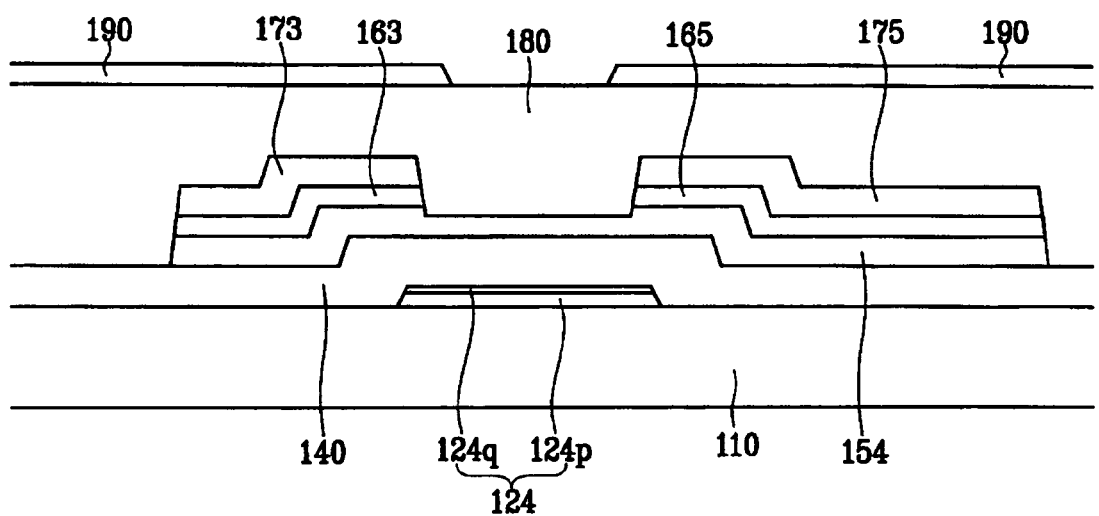

FIG. 1 is a layout view of a TFT array panel for an LCD according to an embodiment of the present invention. FIGS. 2 and 3 are sectional views of the TFT array panel shown in FIG. 1 taken along the lines II-II' and III-III', respectively.

A plurality of gate lines 121 and a plurality of storage electrode lines 131 are formed on an insulating substrate 110 such as transparent glass. The gate lines 121 for transmitting gate signals extend substantially in a transverse direction and are separated from each other. Each gate line 121 includes a plurality of gate electrodes 124 and an end portion 129 having an area for contacting another layer or an external driving circuit. The gate lines 121 may extend to be connected to a driving circuit that may be integrated on the insulating substrate 110.

Each storage electrode line 131 separated from the gate lines 121 extends substantially in the transverse direction and is disposed between adjacent gate lines 121. The storage electrode lines 131 are supplied with a predetermined voltage such as a common voltage of the other panel (not shown). The storage electrode lines 131 may include a plurality of expansions, and may be closely located to the gate lines 121 for enhancing an aperture ratio. The gate lines 121 and the storage electrode lines 131 may comprise an Al containing metal such as Al or Al alloy, an Ag containing metal such as Ag or Ag alloy, a Cu containing metal such as Cu or Cu alloy, a Mo containing metal such as Mo or Mo alloy, Cr, Ti or Ta.

As shown in FIG. 2, the gate lines 121 include two films, i.e., a lower film 121p and an upper film 121q, having different physical, chemical and/or electrical characteristics. The upper film 121q may comprise a low resistivity metal such as, for example, Al or Al alloy for reducing signal delay or voltage drop in the gate lines 121. The upper film has a thickness in the range of about 1,000 Å to about 3,0000 Å. The lower film 121p may comprise a material such as Cr, Mo or Mo alloy, which has good physical, chemical, and/or electrical contact characteristics with other materials such as indium tin oxide (ITO) or indium zinc oxide (IZO). The lower film 121p has a thickness in the range of about 100 Å to about 1,000 Å. An exemplary combination of the lower film material and the upper film material is Mo for the lower film and Al—Nd alloy for the upper film. The positions of the upper and lower films may be exchanged with each other.

In FIGS. 2 and 3, the lower and the upper films of the gate electrodes 124 are indicated by reference numerals 124p and 124q, respectively. The lower and the upper films of the end portions 129 are indicated by reference numerals 129p and 129q, respectively. The lower and the upper films of the storage electrode lines 131 are indicated by reference numerals 131p and 131q, respectively. Portions of the upper film 129q of the end portions 129 of the gate lines 121 may be removed to expose underlying portions of the lower films 129p.

The lateral sides of the upper film 121q, 124q, 129q and 131q, and the lower film 121p, 124p, 129p and 131p are tapered. The inclination angle of the lateral sides with respect to a surface of the substrate 110 ranges from about 30° to about 80°.

A gate insulating layer 140 comprising silicon nitride (SiNx) is formed on the gate lines 121 and the storage electrode lines 131. A plurality of semiconductor stripes 151 comprising hydrogenated amorphous silicon (abbreviated to "a-Si") are formed on the gate insulating layer 140. Each semiconductor stripe 151 extends substantially in a longitudinal direction and includes a plurality of projections 154 branched out toward the gate electrodes 124.

A plurality of ohmic contact stripes and islands 161 and 165 comprising, for example, silicide or n+ hydrogenated a-Si heavily doped with n type impurity are formed on the semiconductor stripes 151. Each ohmic contact stripe 161 has a plurality of projections 163. The projections 163 and the ohmic contact islands 165 are located in pairs on the projections 154 of the semiconductor stripes 151.

The lateral sides of the semiconductor stripes 151 and the ohmic contacts 161 and 165 are tapered. The inclination angles of the lateral sides are preferably in a range between about 30° and about 80°.

A plurality of data lines 171 and a plurality of drain electrodes 175 are formed on the ohmic contacts 161 and 165. The data lines 171 for transmitting data voltages extend substantially in the longitudinal direction and intersect the gate lines 121, and include a plurality of end portions 179 having an area for contacting another layer or an external driving circuit. A plurality of branches of each data line 171 projecting toward the drain electrodes 175 form a plurality of source electrodes 173. Each pair of the source electrodes 173 and the drain electrodes 175 are separated from and opposite each other with respect to a gate electrode 124. The gate electrode 124, the source electrode 173, and the drain electrode 175 along with a projection 154 of a semiconductor stripe 151 form a TFT having a channel formed in the projection 154 disposed between the source electrode 173 and the drain electrode 175.

The data lines 171 and the drain electrodes 175 may comprise an Al containing metal such as Al or Al alloy, an Ag containing metal such as Ag or Ag alloy, a Cu containing metal such as Cu or Cu alloy, a Mo containing metal such as Mo or Mo alloy, Cr, Ti or Ta. The data lines 171 and the drain electrodes 175 may have a single-layered or multi-layered structure. In an embodiment of the present invention, the data lines 171 and the drain electrodes 175 comprise Mo or Mo ally as a single layer.

Similar to the gate lines 121, the data lines 171 and the drain electrodes 175 have tapered lateral sides, and the inclination angles of the tapered lateral sides range from about 30° to about 80°.

The ohmic contacts 161 and 165 are interposed between the semiconductor stripes 151 and the data lines 171 and the drain electrodes 175 and reduce the contact resistance therebetween.

The semiconductor stripes 151 of the TFT array panel according to an embodiment of the present invention have substantially the same planar shapes as the data lines 171, the drain electrodes 175, and the ohmic contacts 161 and 165. The projections 154 of the semiconductor stripes 151 include some exposed portions, which are not covered by the data lines 171 and the drain electrodes 175. The exposed portions include a portion located between the source electrodes 173 and the drain electrodes 175.

A passivation layer 180 is formed on the data lines 171, the drain electrodes 175, and the exposed portions of the semiconductor stripes 151. The passivation layer 180 may comprise an inorganic insulator such as silicon nitride or silicon oxide, a photosensitive organic material having a good flatness characteristic, or a low dielectric insulating material such as a-Si:C:O and a-Si:O:F formed by plasma enhanced chemical vapor deposition (PECVD). The passivation layer 180 may have a double-layered structure including a lower inorganic film and an upper organic film.

The passivation layer 180 has a plurality of contact holes 185 and 182 exposing the drain electrodes 175 and end portions 179 of the data lines 171, respectively. The passivation layer 180 and the gate insulating layer 140 have a plurality of contact holes 182 exposing end portions 129 of the gate lines 121.

A plurality of pixel electrodes 190 and a plurality of contact assistants 81 and 82, comprising, for example, IZO or ITO, are formed on the passivation layer 180.

The pixel electrodes 190 are physically and electrically connected to the drain electrodes 175 through the contact holes 185 for receiving data voltages from the drain electrodes 175.

The pixel electrodes 190 supplied with the data voltages generate electric fields in cooperation with the common electrode on the other panel (not shown) for reorienting liquid crystal molecules in a liquid crystal layer disposed between the pixel electrodes 190 and the common electrode.

A pixel electrode 190 and a common electrode form a liquid crystal capacitor for storing applied voltages after turn-off of the TFT. An additional capacitor called a "storage capacitor," which is connected in parallel to the liquid crystal capacitor, is provided for enhancing a voltage storing capacity. The storage capacitors are configured by overlapping the pixel electrodes 190 with the gate lines 121 adjacent thereto (called "previous gate lines") or the storage electrode lines 131.

The pixel electrodes 190 may overlap the gate lines 121 and the data lines 171 to increase an aperture ratio.

The contact assistants 81 and 82 are connected to the exposed end portions 129 of the gate lines 121 and the exposed end portions 179 of the data lines 171 through the contact holes 181 and 182, respectively. The contact assistants 81 and 82 may protect the exposed portions 129 and 179 and improve the adhesiveness of the exposed portions 129 and 179 and external devices.

According to an embodiment of the present invention, the pixel electrodes 190 comprise a transparent conductive polymer. For a reflective type LCD, the pixel electrodes 190 comprise an opaque reflective metal, and the contact assistants 81 and 82 may comprise a material such as IZO or ITO that is different from the pixel electrodes 190.

A method of manufacturing the TFT array panel shown in FIGS. 1 to 3 according to an embodiment of the present invention will be now described in detail with reference to FIGS. 4 to 13B as well as FIGS. 1 to 3.

Figure 4:
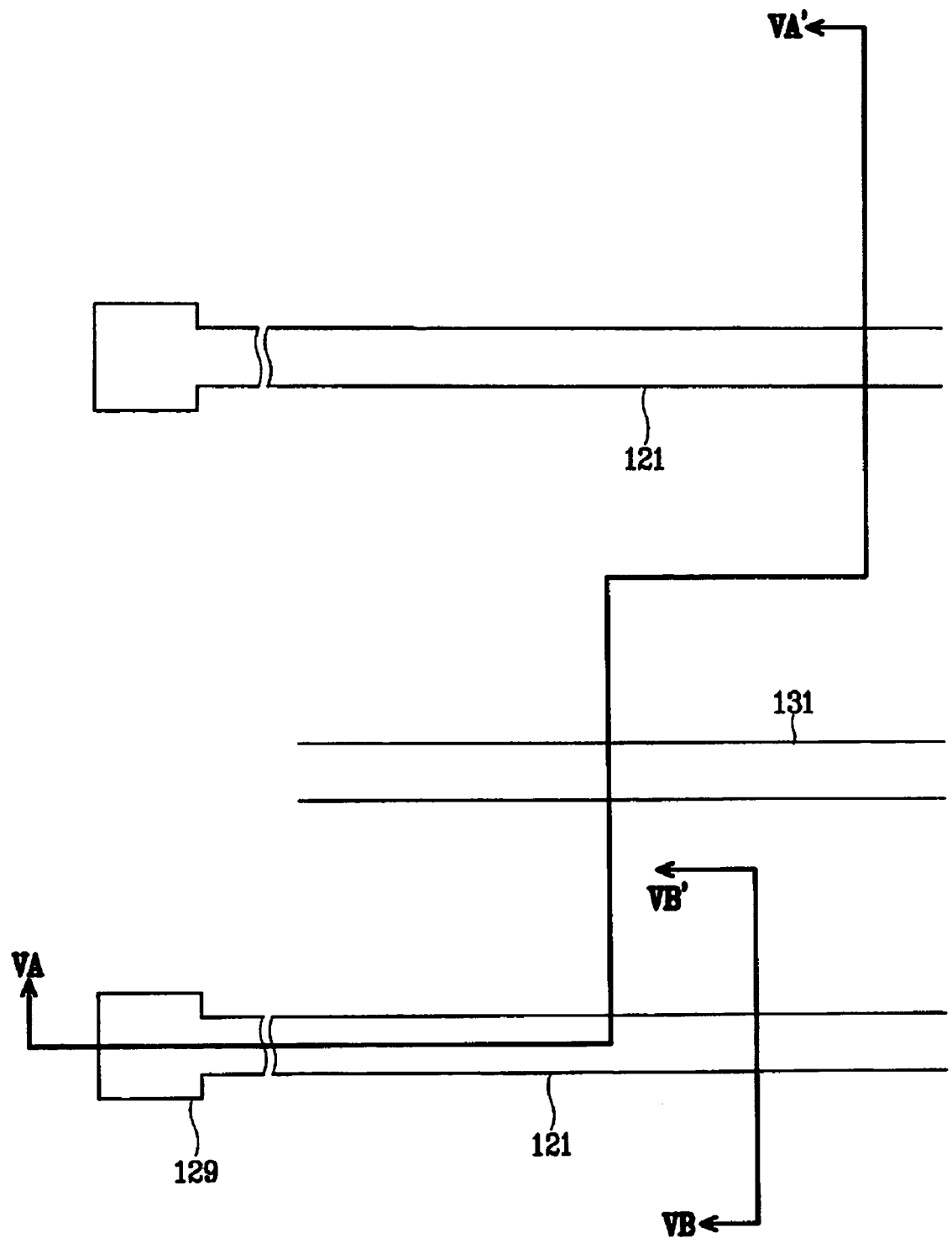
FIG. 4 is a layout view of a TFT array panel shown in FIGS. 1-3 showing a step of a manufacturing method of the TFT array panel according to an embodiment of the present invention.
Figure 5B:
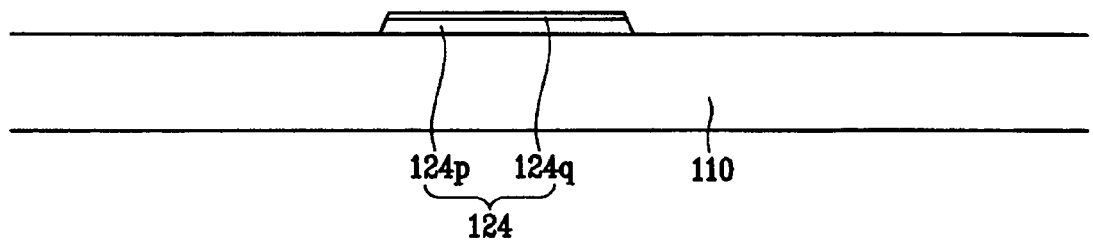
Figure 6A:
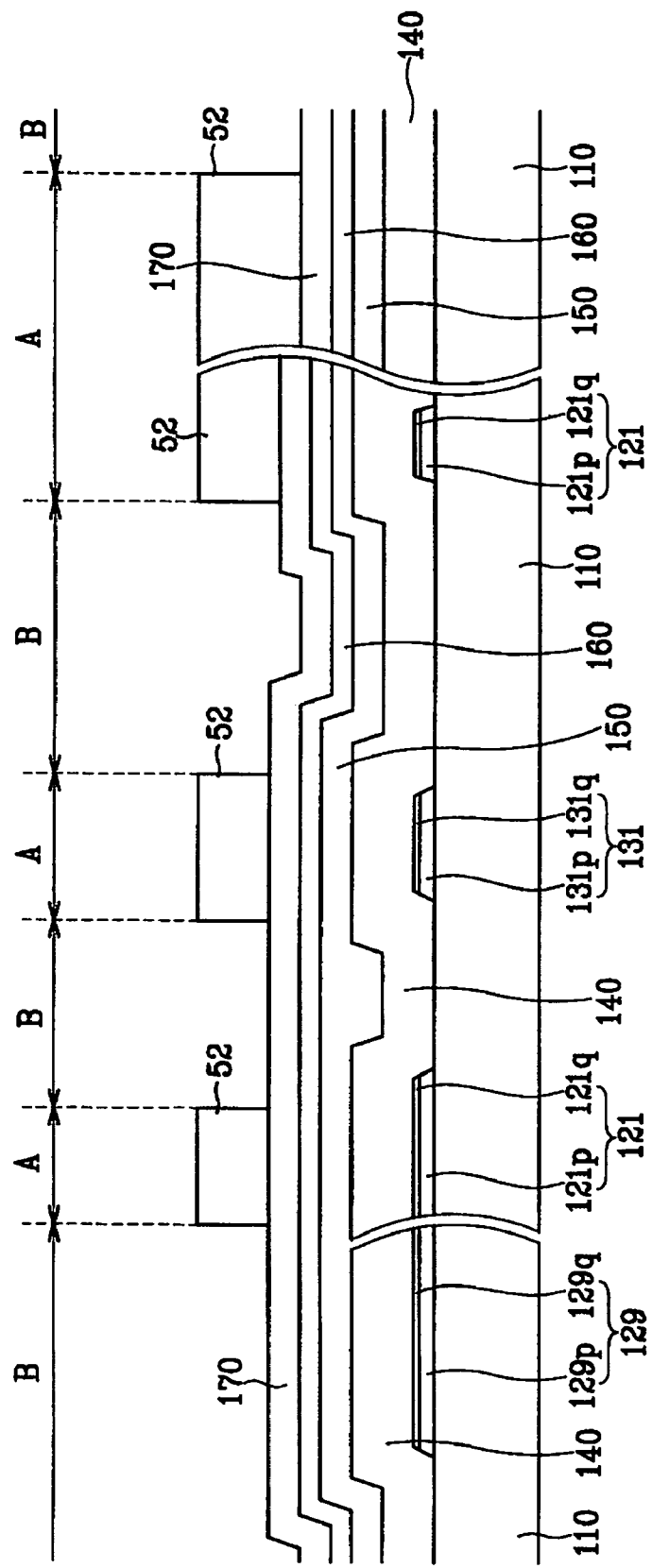
FIGS. 6A and 6B are sectional views of the TFT array panel shown in FIG. 4 taken along the lines VA-VA' and VB-VB', respectively, and illustrate a manufacturing step following the manufacturing step shown in FIGS. 5A and 5B.
Figure 6B:
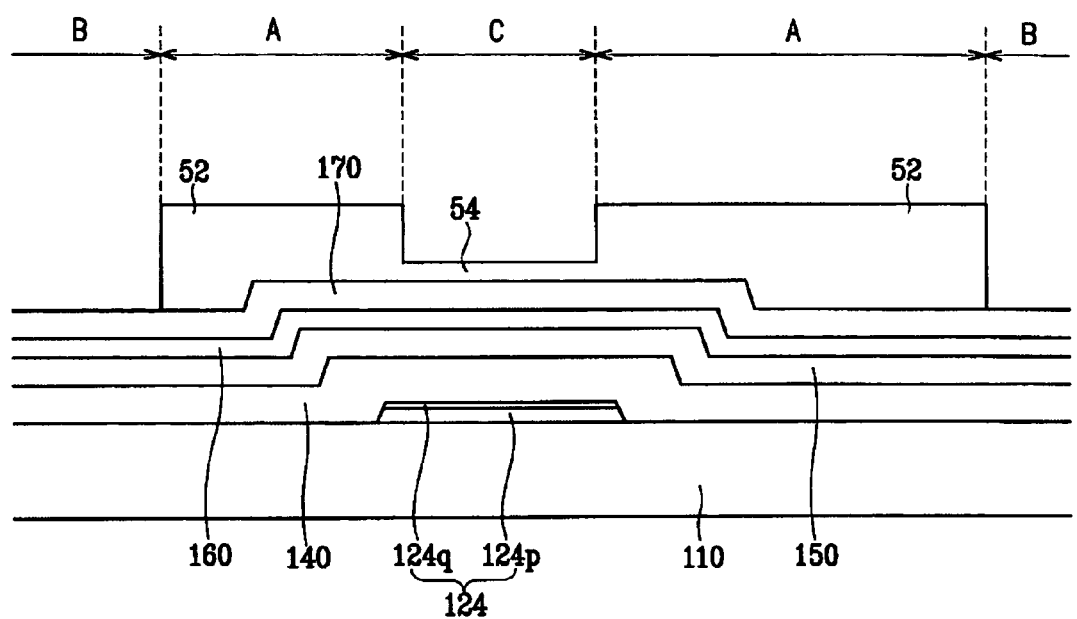
Figure 6C:
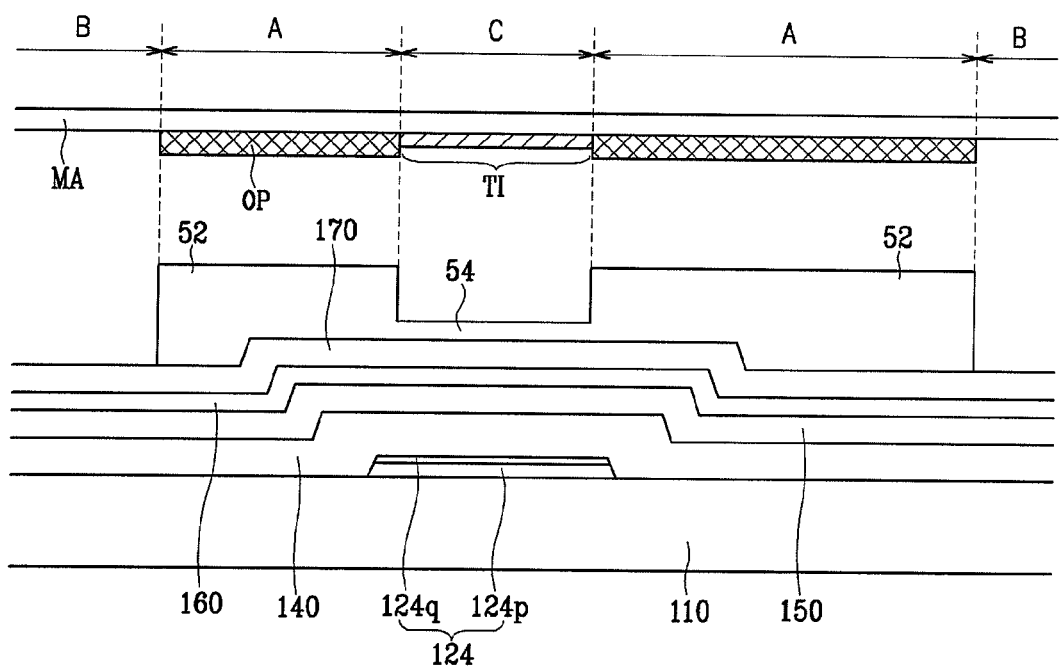
FIGS. 6C and 6D are sectional views showing a single exposure mask, a thin film with intermediate transmittance and a plurality of slits formed in a single exposure mask, according to an embodiment of the present invention.
Figure 6D:
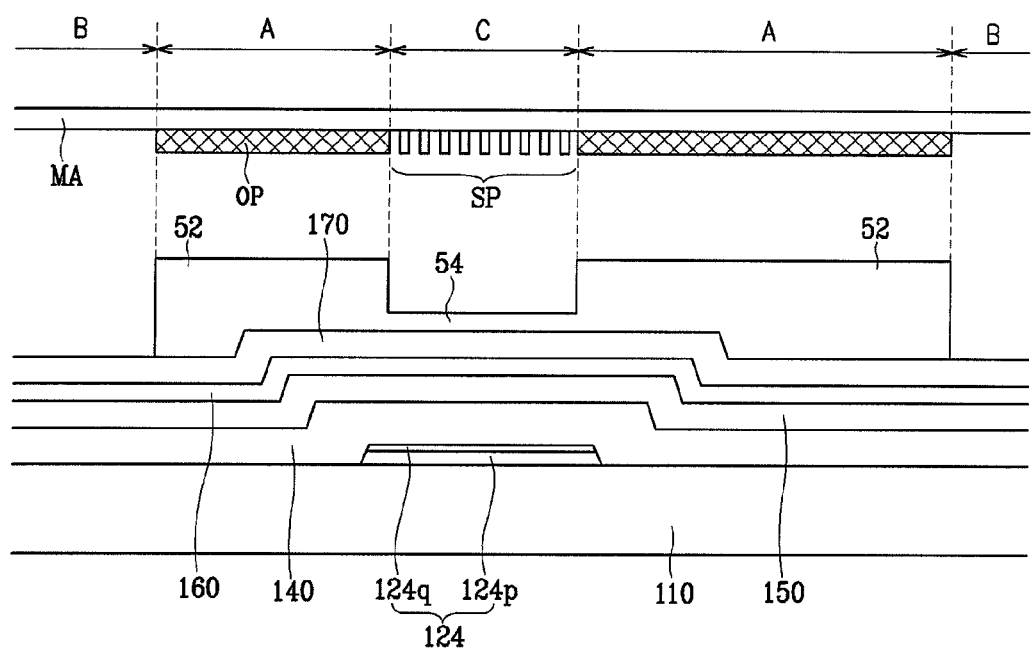
Figure 7A:
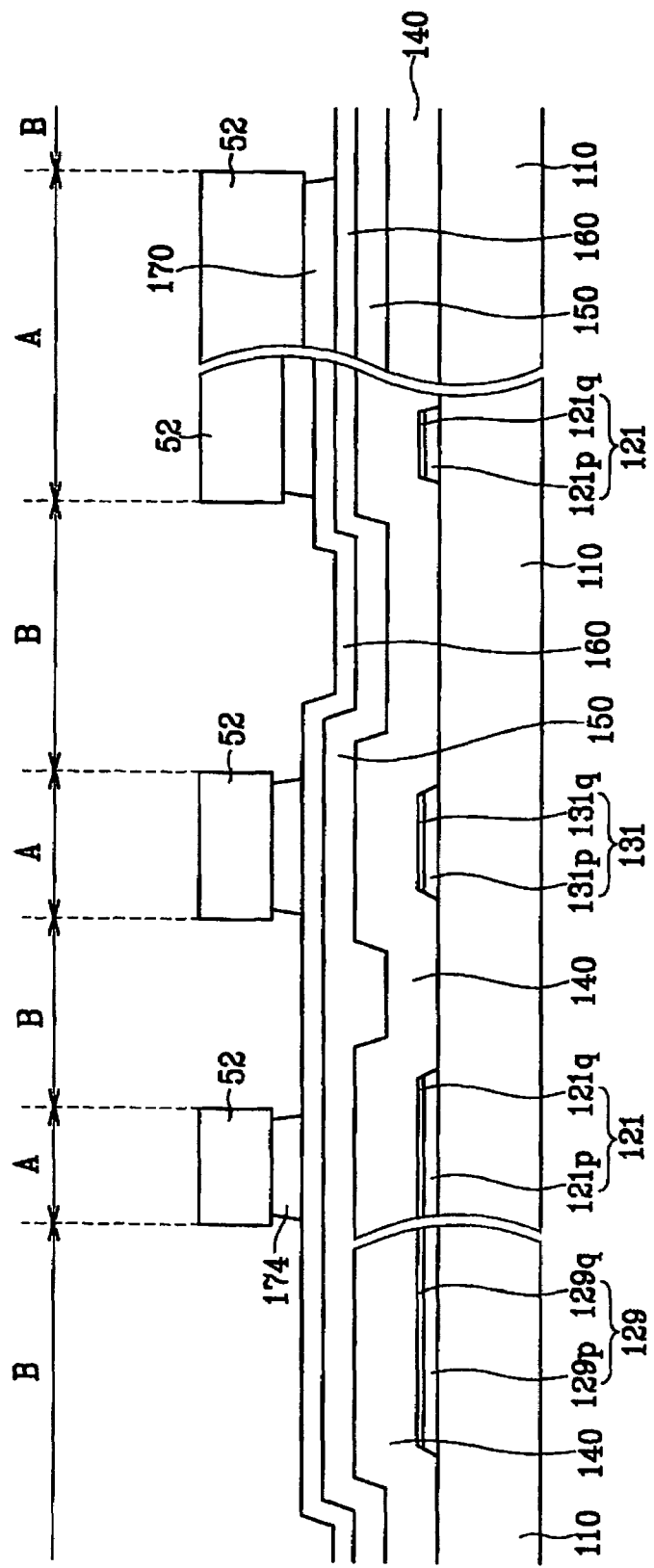
FIGS. 7A and 7B are sectional views of the TFT array panel shown in FIG. 4 taken along the lines VA-VA' and VB-VB', respectively, and illustrate a manufacturing step following the manufacturing step shown in FIGS. 6A and 6B.
Figure 7B:
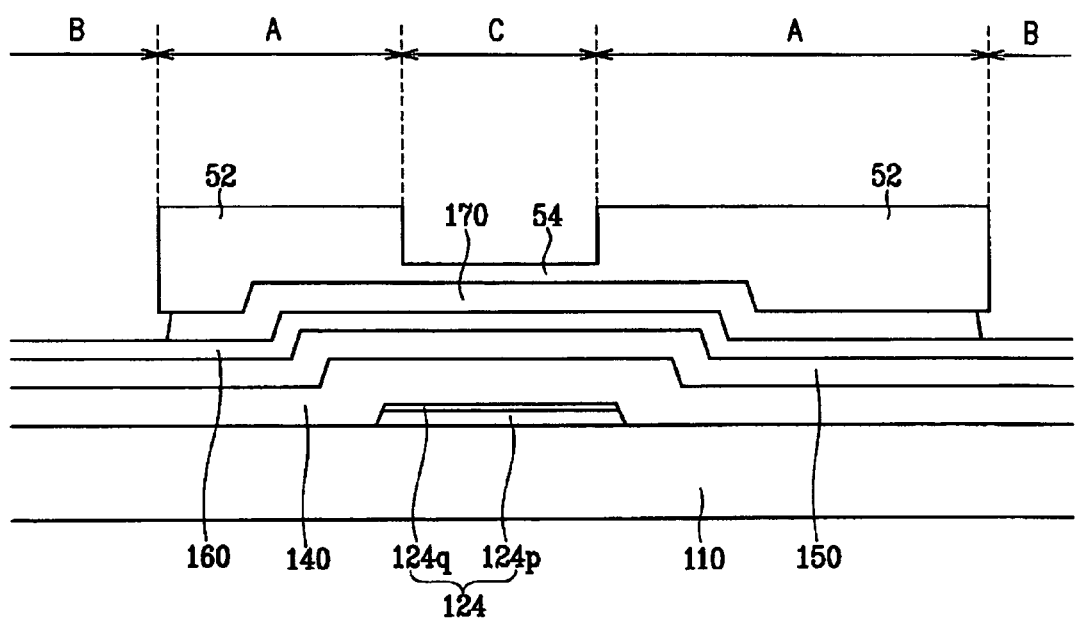
Figure 8A:
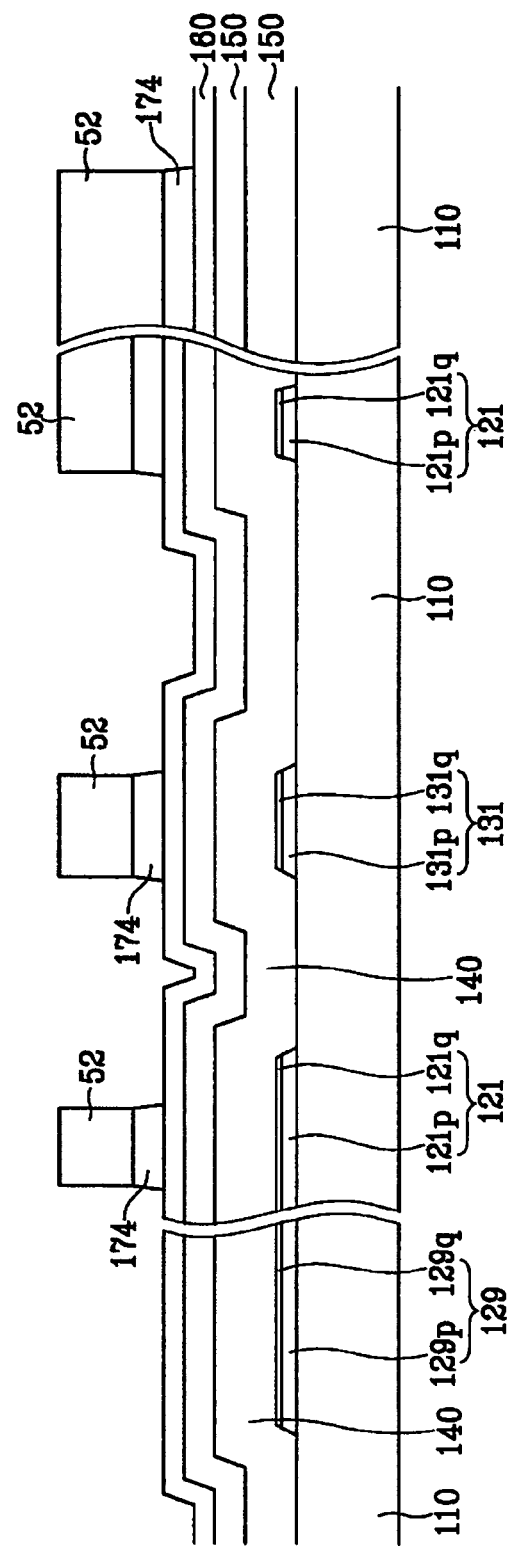
FIGS. 8A and 8B are sectional views of the TFT array panel shown in FIG. 4 taken along the lines VA-VA' and VB-VB', respectively, and illustrate a manufacturing step following the manufacturing step shown in FIGS. 7A and 7B.
Figure 8B:
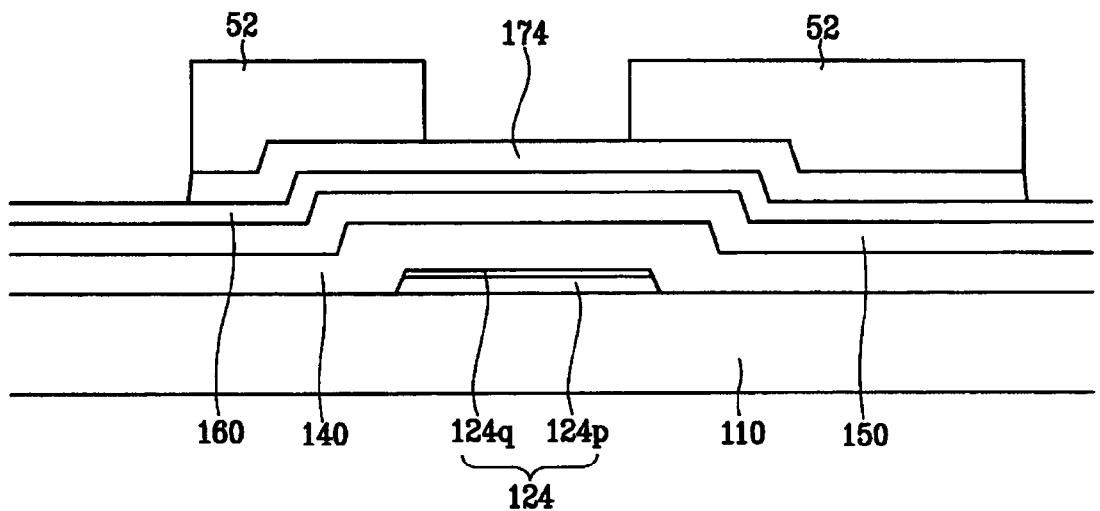
Figure 9A:
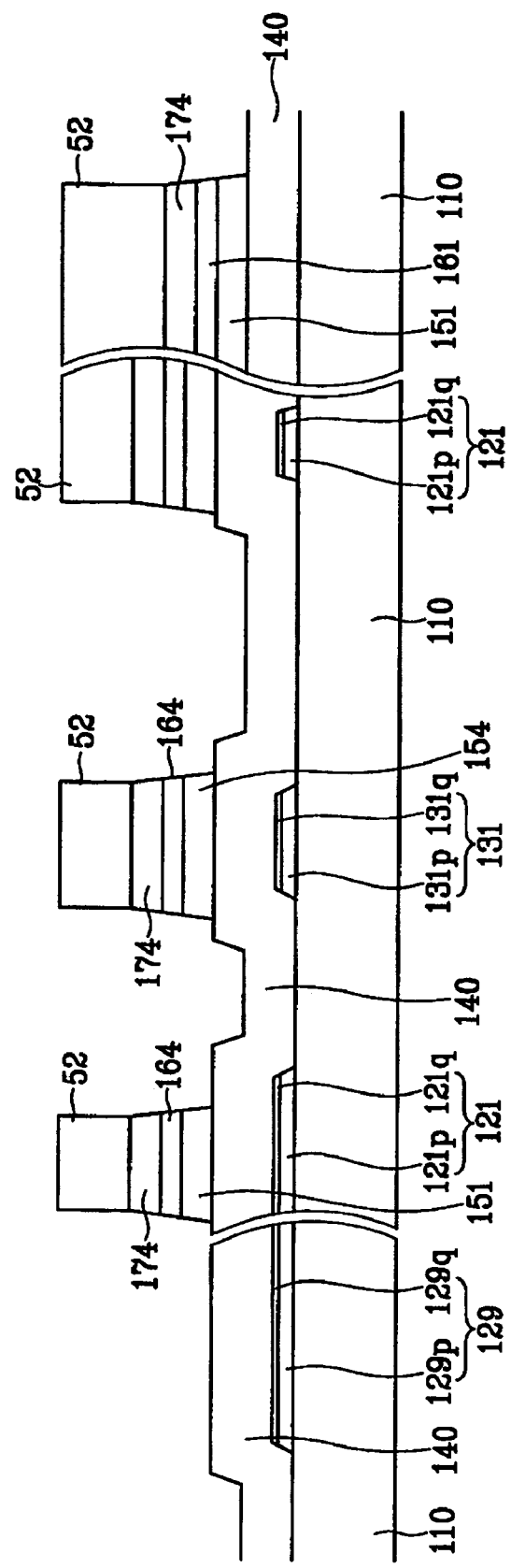
FIGS. 9A and 9B are sectional views of the TFT array panel shown in FIG. 4 taken along the lines VA-VA' and VB-VB', respectively, and illustrate a manufacturing step following the step shown in FIGS. 8A and 8B.
Figure 9B:
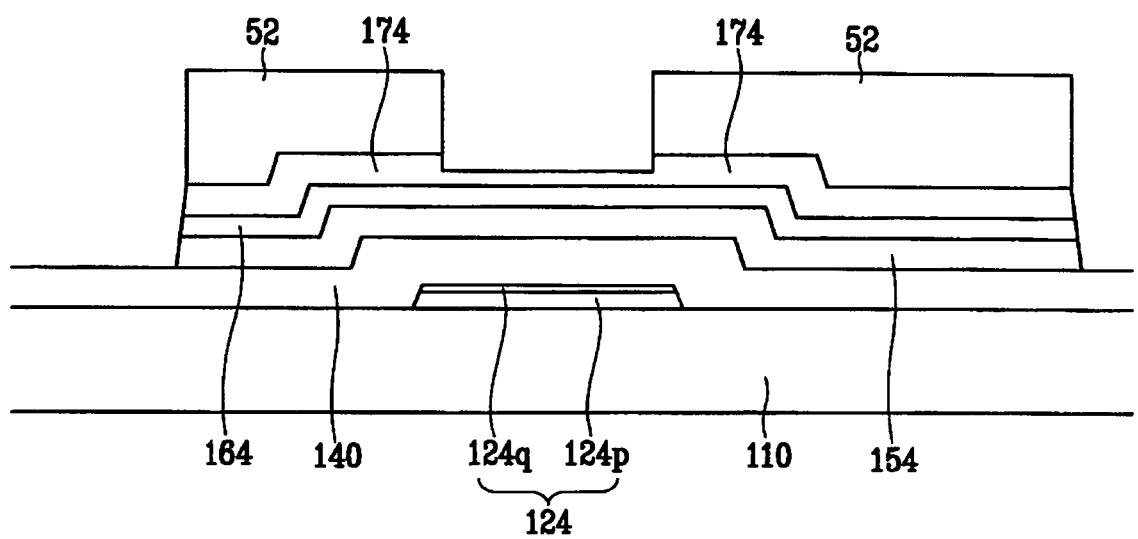
Figure 10:
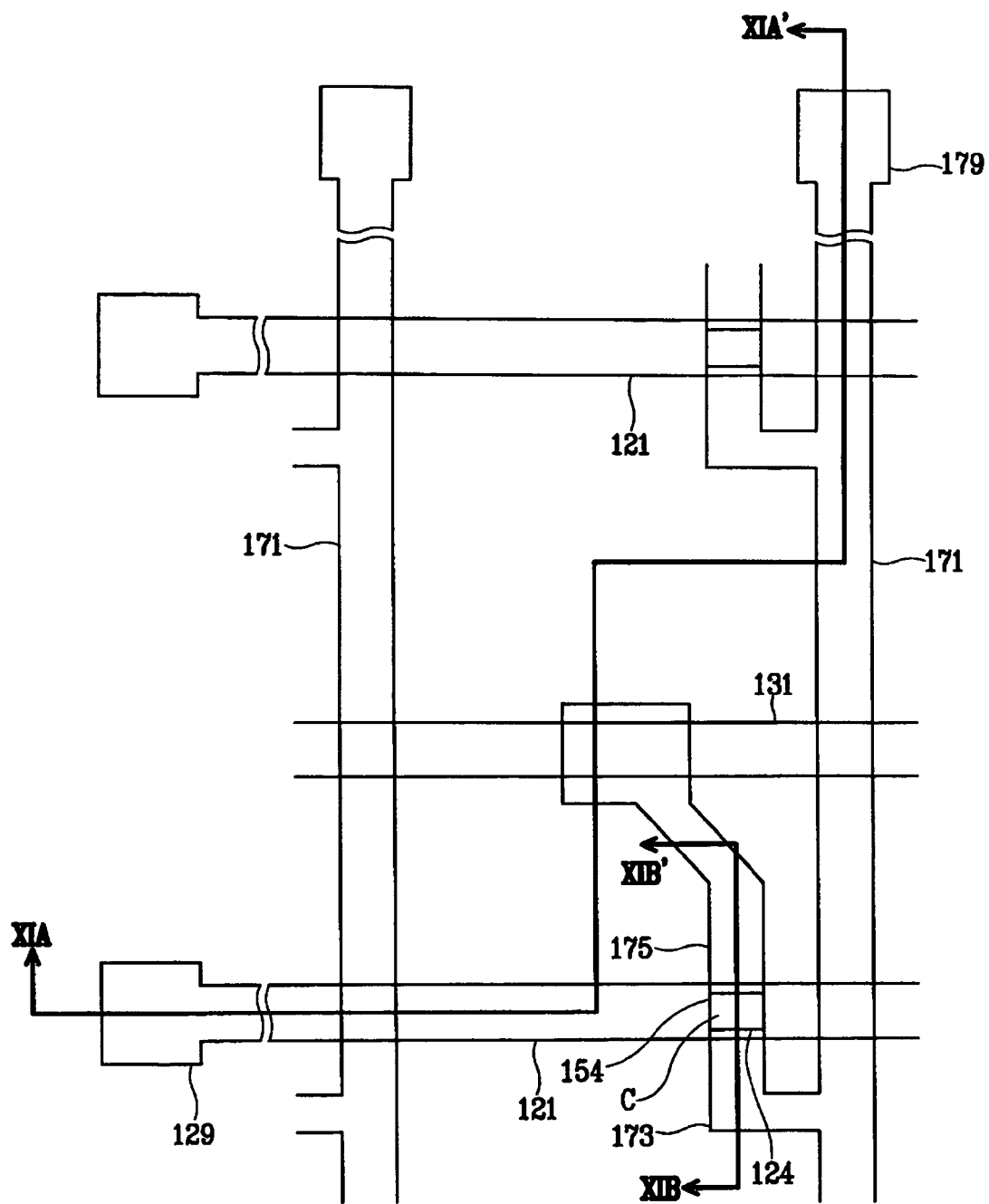
FIG. 10 is a layout view of the TFT array panel showing a manufacturing step following the manufacturing step shown in FIGS. 9A and 9B.
Figure 11A:
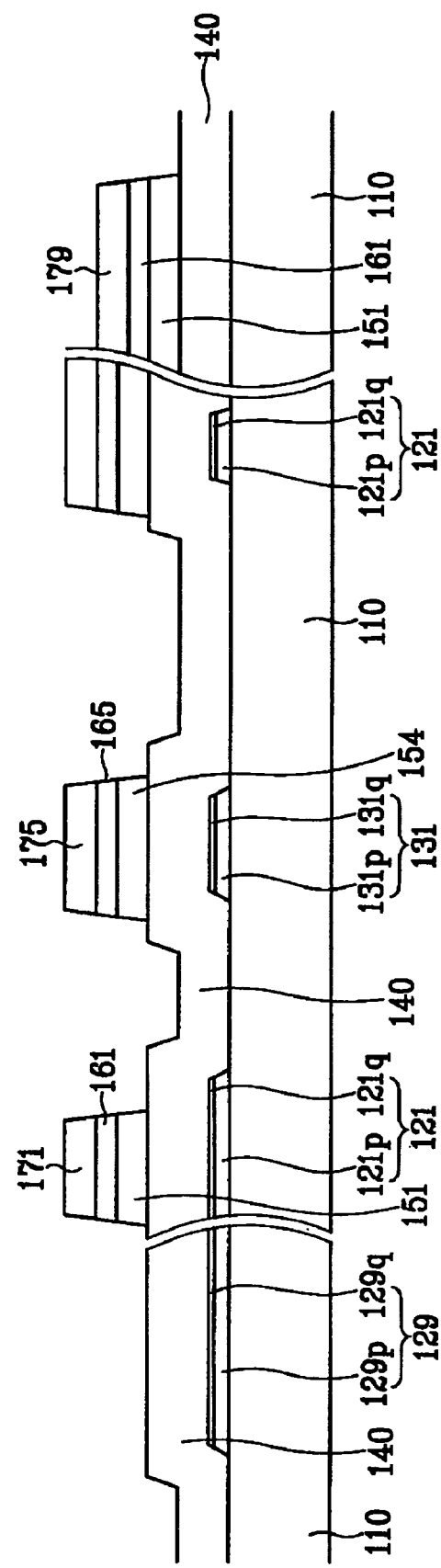
FIGS. 11A and 11B are sectional views of the TFT array panel shown in FIG. 10 taken along the lines XIA-XIA' and XIB-XIB', respectively.
Figure 11B:
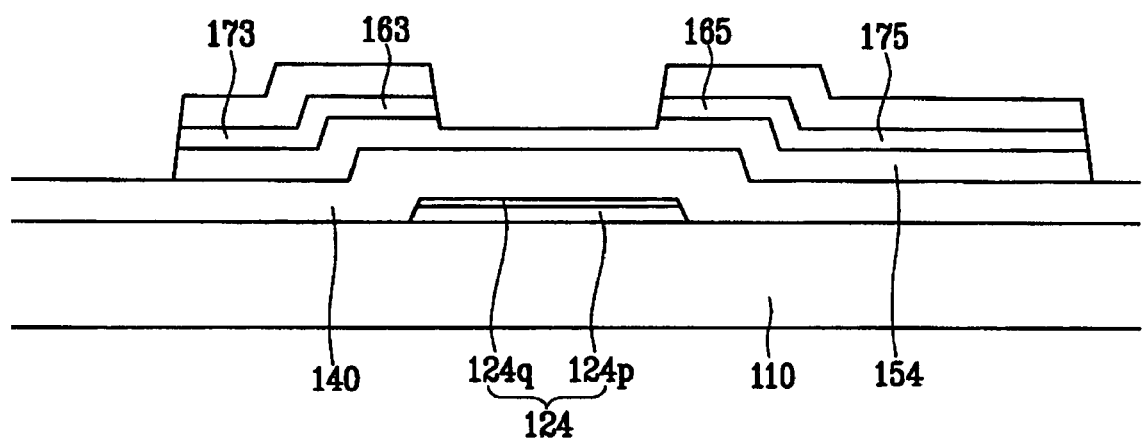

FIG. 4 is a layout view of a TFT array panel shown in FIGS. 1-3 showing a step of a manufacturing method of the TFT array panel according to an embodiment of the present invention. FIGS. 5A and 5B are sectional views of the TFT array panel shown in FIG. 4 taken along the lines VA-VA' and VB-VB', respectively. FIGS. 6A and 6B are sectional views of the TFT array panel shown in FIG. 4 taken along the lines VA-VA' and VB-VB', respectively, and illustrate a manufacturing step following the manufacturing step shown in FIGS. 5A and 5B. FIGS. 7A and 7B are sectional views of the TFT array panel shown in FIG. 4 taken along the lines VA-VA' and VB-VB', respectively, and illustrate a manufacturing step following the manufacturing step shown in FIGS. 6A and 6B. FIGS. 8A and 8B are sectional views of the TFT array panel shown in FIG. 4 taken along the lines VA-VA' and VB-VB', respectively, and illustrate a manufacturing step following the manufacturing step shown in FIGS. 7A and 7B. FIGS. 9A and 9B are sectional views of the TFT array panel shown in FIG. 4 taken along the lines VA-VA' and VB-VB', respectively, and illustrate a manufacturing step following the step shown in FIGS. 8A and 8B. FIG. 10 is a layout view of the TFT array panel showing a manufacturing step following the manufacturing step shown in FIGS. 9A and 9B. FIGS. 11A and 11B are sectional views of the TFT array panel shown in FIG. 10 taken along the lines XIA-XIA' and XIB-XIB', respectively.

Two conductive films, i.e., a lower conductive film and an upper conductive film, are sputtered in sequence on an insulating substrate 110 such as, for example, transparent glass. The lower conductive film may comprise a material such as Al or Al alloy, and may have a thickness in the range of about 1,000 Å to about 3,000 Å. The upper conductive film may comprise Mo or Mo alloy, and may have a thickness in the range of about 500 Å to about 1,000 Å.

Referring to FIGS. 4, 5A and 5B, after forming a photoresist on the upper conductive film, the upper conductive film and the lower conductive film are patterned in sequence using the photoresist as an etch mask to form a plurality of gate lines 121 and a plurality of storage electrode lines 131. The plurality of gate lines 121 include a plurality of gate electrodes 124. Then, the photoresist is removed.

The patterning of the upper film 121$q$ and 131$q$ and the lower film 121$p$ and 131$p$ is performed by wet etching using, for example, an Al etchant including $CH_3COOH$, $HNO_3$, $H_3PO_3$ and $H_2O$. The Al etchant can etch both Al and Mo with inclined etch profiles.

Referring to FIGS. 6A and 6B, a gate insulating layer 140, an intrinsic a-Si layer 150, and an extrinsic a-Si layer 160 are sequentially deposited by CVD. The layers 140, 150 and 160 have thicknesses of about 1,500 Å to about 5,000 Å, about 500 Å to about 2,000 Å and about 300 Å to about 600 Å, respectively. A conductive layer 170 is deposited by sputtering, and a photoresist with the thickness of about 1 μm to about 2 μm is coated on the conductive layer 170. The photoresist is exposed to light through an exposure mask (not shown) and developed to form photoresist film 52 and 54.

The photoresist film 52 and 54 has a position-dependent thickness. The photoresist shown in FIGS. 6A and 6B includes a plurality of first to third portions with different thicknesses, for example, decreasing thickness from first to third portions. The first portions located on wire areas A and the second portions located on channel areas C are indicated by reference numerals 52 and 54, respectively. No reference numeral is assigned to the third portions located on remaining areas B since the photoresist on the third portions has substantially zero thickness to expose underlying portions of the conductive layer 170. The thickness ratio of the second portions 54 to the first portions 52 is adjusted based on process conditions in subsequent steps. The thickness of the second portions 54 may be equal to or less than about half of the thickness of the first portions 52. The thickness of the second portion 54 is equal to or less than about 4,000 Å.

Referring to FIGS. 6A through 6D, the position-dependent thickness of the photoresist can be obtained by several techniques. The techniques include, for example, using a mask MA having a slit pattern SP, a lattice pattern, or a thin film(s) TI with intermediate transmittance or intermediate thickness. The slit pattern SP, the lattice pattern and the thin film TI can control the amount of light reaching the second portion 54 of the photoresist. When using the slit pattern SP, the width of the slits or the distance between the slits may be smaller than the resolution of a light exposer used for the photolithography. A reflowable photoresist can also be used. Once a photoresist pattern comprising a reflowable material is formed by using an exposure mask only with transparent areas and opaque areas OP, it is subject to a reflow process to flow onto areas without the photoresist, thereby forming thin portions.

The different thickness of the photoresist film 52 and 54 enables selective etching of the underlying layers. Therefore, a plurality of data lines 171 including a plurality of source electrodes 173, a plurality of drain electrodes 175, a plurality of ohmic contact stripes 161 including a plurality of projections 163, a plurality of ohmic contact islands 165, and a plurality of semiconductor stripes 151 including a plurality of projections 154 are obtained as shown in FIGS. 10, 11A and 11B by a series of etching steps.

Portions of the conductive layer 170, the extrinsic a-Si layer 160, and the intrinsic a-Si layer 150 on the wire areas A are called first portions. Portions of the conductive layer 170, the extrinsic a-Si layer 160, and the intrinsic a-Si layer 150 on the channel areas C are called second portions. Portions of the conductive layer 170, the extrinsic a-Si layer 160, and the intrinsic a-Si layer 150 on the remaining areas B are called third portions.

According to an embodiment of the present invention, the above structure can be formed by the following process: Third portions of the conductive layer 170, the extrinsic a-Si layer 160 and the intrinsic a-Si layer 150 on the remaining areas B are removed; the second portions 54 of the photoresist are removed; the second portions of the conductive layer 170 and the extrinsic a-Si layer 160 on the channel areas C are removed; and the first portions 52 of the photoresist are removed.

According to an embodiment of the present invention, the above structure can be formed by the following process: The third portions of the conductive layer 170 are removed; the second portions 54 of the photoresist are removed; the third portions of the extrinsic a-Si layer 160 and the intrinsic a-Si layer 150 are removed; the second portions of the conductive layer 170 are removed; the first portions 52 of the photoresist are removed; and the second portions of the extrinsic a-Si layer 160 are removed. This embodiment is described below in detail.

Referring to FIGS. 7A and 7B, the exposed third portions of the conductive layer 170 on the remaining areas B are removed by wet etching or dry etching to expose the underlying third portions of the extrinsic a-Si layer 160. Mo containing metal films can be etched both by dry etching and wet etching. A double layer including Al and Mo may be simultaneously etched under the same etching condition. The upper portion of the photoresist film 52 and 54 may be etched when dry etching is performed.

Reference numeral 174 indicates conductors of the conductive layer 170 including the data lines 171 and the drain electrode 175 connected to each other. The conductors 174 are over-etched under the photoresist film 52 and 54, thereby making an under-cut structure.

Referring to FIGS. 8A and 8B, an etch back process is performed by ashing to remove the second portions 54 of the photoresist on the second portions of the conductors 174. The second portions of the conductors 174 are exposed and some of the first portions 52 are removed, thereby the thickness and the width of the first portions 52 are decreased. As a result, the under-cut structure is eliminated.

Referring to FIGS. 9A and 9B, the third portions of the extrinsic a-Si layer 160 and of the intrinsic a-Si layer 150 on the remaining areas B are removed preferably by dry etching. The upper portions of the third portions of the conductor 174 are etched, as shown in FIG. 9B, to reduce the etching time of the conductors 174 of the channel areas C.

As a result, the semiconductor stripes 151 are completed, and reference numeral 164 indicates portions of the extrinsic a-Si layer 160 including the ohmic contact stripes and islands 161 and 165 connected to each other, which are called "extrinsic semiconductor stripes."

Referring to FIGS. 10, 11A and 11B, the second portions of the conductors 174, and the extrinsic a-Si stripes 164 on the areas C and the first portion 52 of the photoresist are removed.

As shown in FIG. 11B, top portions of the projections 154 of the intrinsic semiconductor stripes 151 on the areas C may be removed to reduce thickness, and the first portions 52 of the photoresist are etched to a predetermined thickness.

Each conductor 174 includes a data line 171 and a plurality of drain electrodes 175. Each extrinsic semiconductor stripe 164 includes an ohmic contact stripe 161 and a plurality of ohmic contact islands 165.

Figure 12:
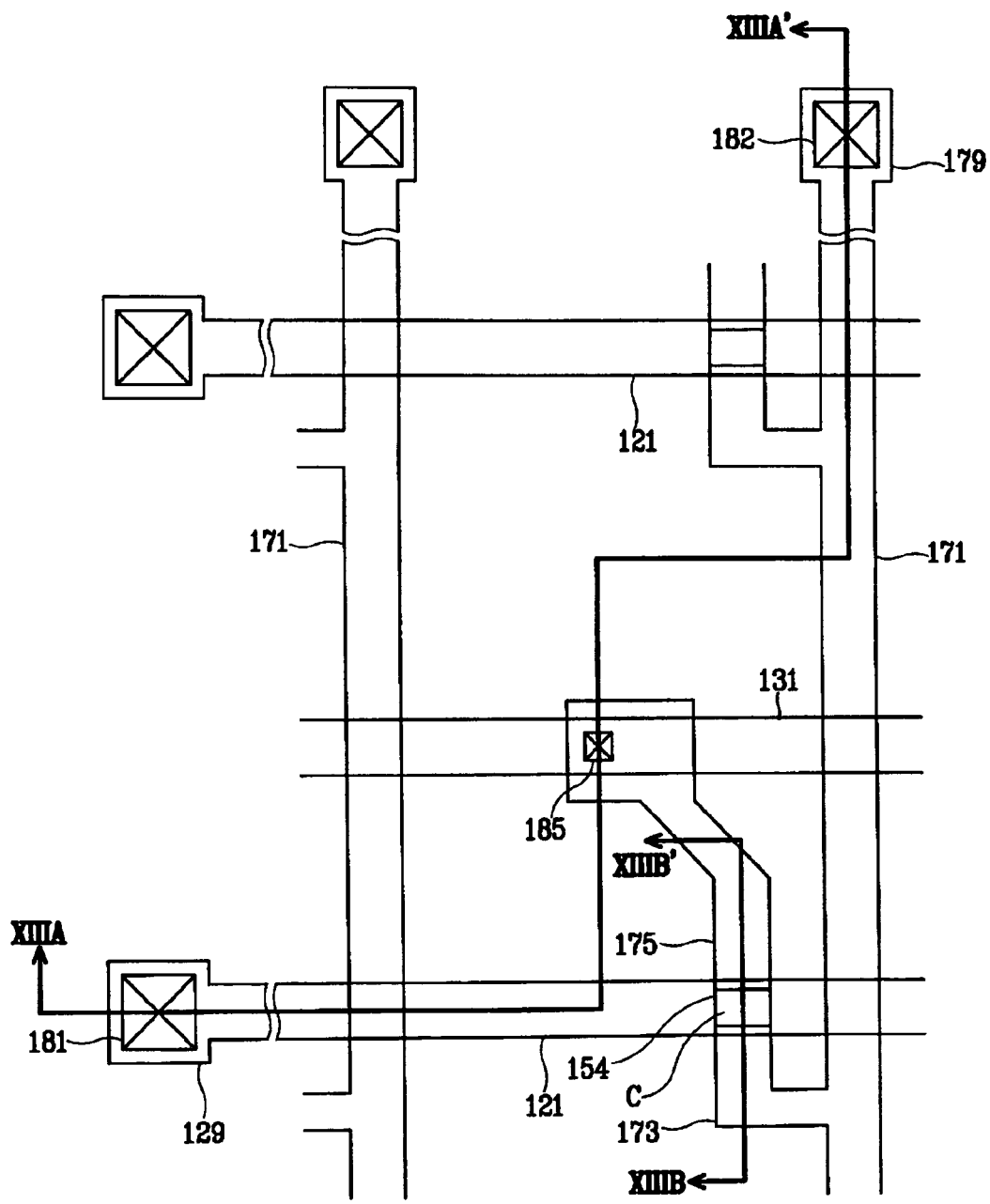
FIG. 12 is a layout view of the TFT array panel showing a manufacturing step following the manufacturing step shown in FIGS. 11A and 11B.
Figure 13A:
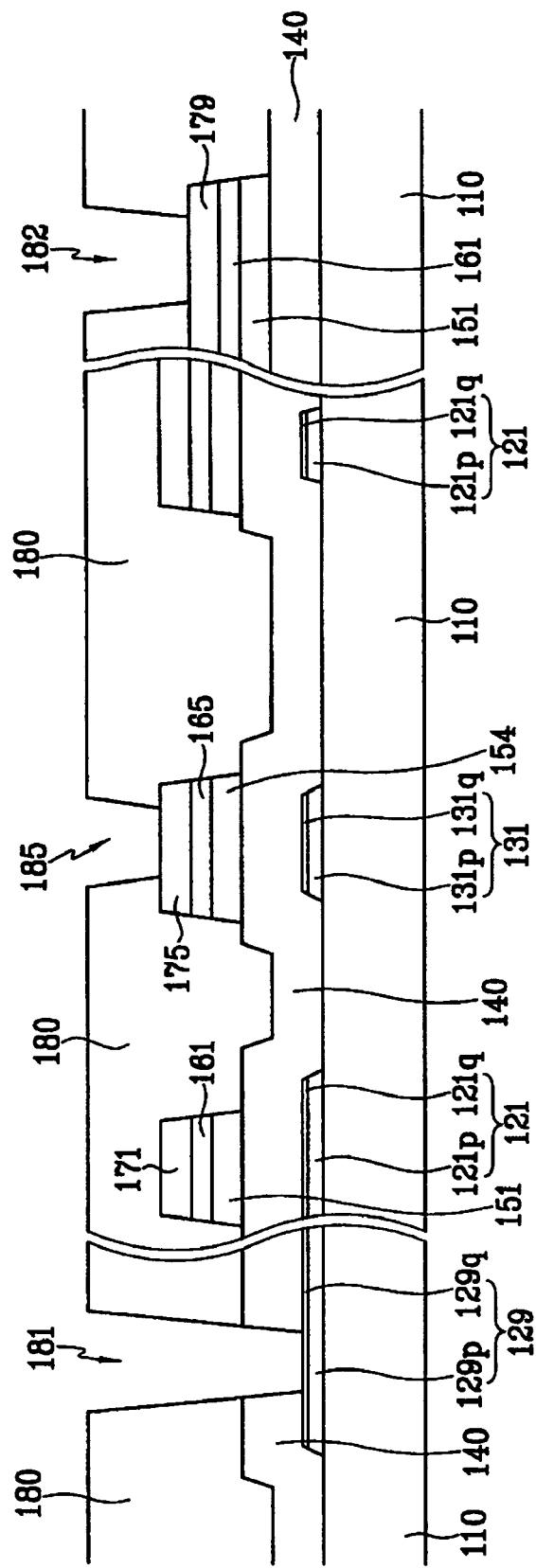
FIGS. 13A and 13B are sectional views of the TFT array panel shown in FIG. 12 taken along the lines XIIIA-XIIIA' and XIIIB-XIIIB', respectively.
Figure 13B:
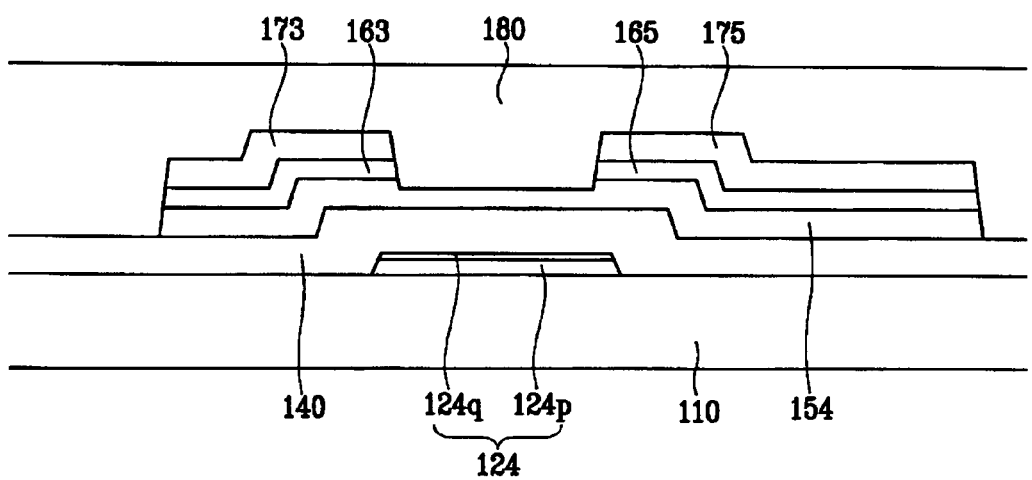

Referring to FIGS. 12, 13A and 13B, a passivation layer 180 is formed by CVD using a silicon nitride, by the coating of an acrylic organic insulating film, or by PECVD of a low dielectric insulating material such as a-Si:C:O or a-Si:O:F having a low dielectric constant. Thereafter, the passivation layer 180 and the gate insulating layer 140 are photo-etched to form a plurality of contact holes 181, 182 and 185.

Then, as shown in FIGS. 1-3, a plurality of pixel electrodes 190 and a plurality of contact assistants 81 and 82 are formed on the passivation layer 180 by sputtering and photo-etching an ITO or IZO layer with the thickness of about 500 Å to about 1,500 Å. The etching of the IZO film may include wet etching using a Cr etchant such as $HNO_3/(NH_4)_2Ce(NO_3)_6/H_2O$, which does not erode the exposed Al portions of the gate lines 121, the data lines 171, and the drain electrodes 175 through the contact holes 182, 181 and 185.

Since the manufacturing method of the TFT array panel, according to an embodiment of the present invention, simultaneously forms the data lines 171, the drain electrodes 175, the semiconductors 151, and the ohmic contacts 161 and 165 using a photoresist having a different thickness in different portions as an etching mask, the manufacturing process is simplified.

As described above, the manufacturing process is simplified. For example, the upper portion of an underlying layer is etched when etching a thin film for reducing the process time.

Although preferred embodiments have been described herein with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method of manufacturing a thin film transistor array panel, the method comprising:
   forming a gate line including a gate electrode;
   forming a gate insulating layer on the gate line;
   forming a semiconductor stripe on the gate insulating layer;
   forming ohmic contacts on the semiconductor stripe;
   forming a data line including a source electrode and a drain electrode on the ohmic contacts;
   depositing a passivation layer on the data line and the drain electrode; and
   forming a pixel electrode connected to the drain electrode, wherein forming the data line, the drain electrode, the ohmic contacts, and the semiconductor stripe comprises:
   depositing an intrinsic silicon layer, an extrinsic silicon layer, and a conductor layer on the gate insulating layer;
   forming a photoresist including a second portion corresponding to a channel area between the source electrode and the drain electrode, and a first portion corresponding to a wire area on the data line and the drain electrode, wherein the first portion is thicker than the second portion;
   etching the conductor layer corresponding to a remaining area except for the wire area and the channel area using the photoresist as an etch mask;
   removing the second portion of the photoresist to expose the conductor layer on the channel area;
   etching the intrinsic silicon layer and the extrinsic silicon layer on the remaining area and a portion of the conductor layer corresponding to the channel area in the same etching step;
   etching the rest of the conductor layer and the extrinsic silicon layer on the channel area after the etching of the portion of the conductor layer; and
   removing the first portion of the photoresist.

2. The method of claim 1, wherein the photoresist is formed by photolithography using a single exposure mask.

3. The method of claim 2, wherein a thin film with intermediate transmittance is formed on the single exposure mask corresponding to the second portion.

4. The method of claim 2, wherein a plurality of slits is formed on the single exposure mask corresponding to the second portion, wherein a width of the slits or a distance between the slits is smaller than a resolution of a light exposer used for the photolithography.

5. The method of claim 1, wherein the second portion of the photoresist is formed by a reflow process.

6. The method of claim 1, wherein a thickness of the second portion of the photoresist is equal to or less than about 4,000 Å.

7. The method of claim 1, wherein a thickness of the second portion of the photoresist is equal to or less than about half of the thickness of the first portion.

8. The method of claim 1, wherein the intrinsic silicon layer and the extrinsic silicon layer on the remaining area and a portion of the conductor layer corresponding to the channel area are etched by wet etching.

9. The method of claim 1, wherein the intrinsic silicon layer and the extrinsic silicon layer on the remaining area and a portion of the conductor layer corresponding to the channel area are etched by drying etching.

* * * * *